United States Patent [19]

Barnard et al.

[11] Patent Number: 4,663,761

[45] Date of Patent: May 5, 1987

[54] SEMICONDUCTOR DIODE LASERS

[75] Inventors: Joseph A. Barnard, Hertfordshire; Edwin Y. B. Pun, Middlesex, both of England

[73] Assignee: The General Electric Company, p.l.c., England

[21] Appl. No.: 656,496

[22] Filed: Oct. 1, 1984

[30] Foreign Application Priority Data

Oct. 12, 1983 [GB] United Kingdom ............... 8327296
Dec. 7, 1983 [GB] United Kingdom ............... 8332679

[51] Int. Cl.$^4$ .............................................. H01S 3/19
[52] U.S. Cl. ........................................ 372/45; 372/47
[58] Field of Search ..................... 372/47, 46, 44, 45

[56] References Cited

U.S. PATENT DOCUMENTS

| 4,183,038 | 1/1980 | Namizaki et al. | 357/17 |
| 4,212,020 | 7/1980 | Yariv et al. | 357/17 |
| 4,334,311 | 6/1982 | Oomura et al. | 372/47 |

FOREIGN PATENT DOCUMENTS 2029083 3/1980 United Kingdom .
2057748 4/1981 United Kingdom .

OTHER PUBLICATIONS

Y. C. Chen et al, "Thermalwaveguiding in Oxide-Defined, Narrow-Stripe, Large-Optical-Cavity Lasers", App. Phys. Lett., vol. 41, No. 2, Jul. 1982, pp. 129-131.

T. P. Lee et al, "Low Threshold Current Transverse Junction Lasers on Semi-Insulating Substrates by M.B.E.", Electronic Letters, vol. 16, No. 13, 19 Jun. 1980, pp. 510-511.

Primary Examiner—James W. Davie
Attorney, Agent, or Firm—Kirschstein, Kirschstein, Ottinger & Israel

[57] ABSTRACT

A semiconductor diode laser of the kind in which laser radiation occurs in an active region in a layer (3) of semiconductor material wherein optical confinement of the radiation to a portion (19) of said layer so as to direct light from said region to a light waveguide is obtained by virtue of differences in the refractive index of different parts of said layer arising from mechanical stresses in said layer, produced, for example, by differential thermal contraction during fabrication of the laser of different parts (9b, 11b and 13, 15 or 21 and 5 or 23 and 3) of the laser structure.

4 Claims, 11 Drawing Figures

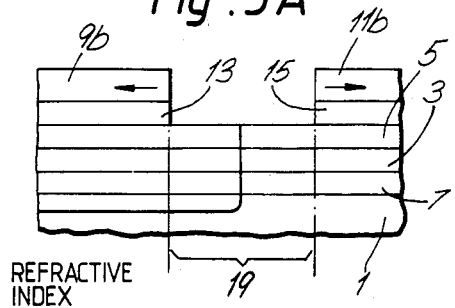
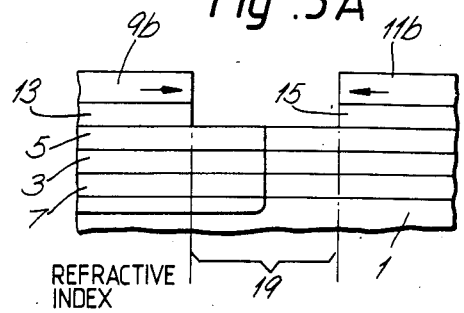
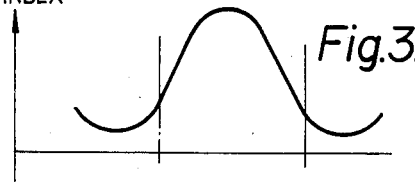
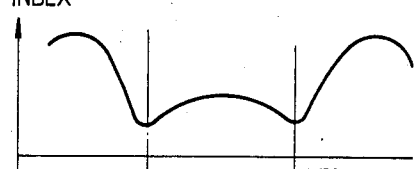
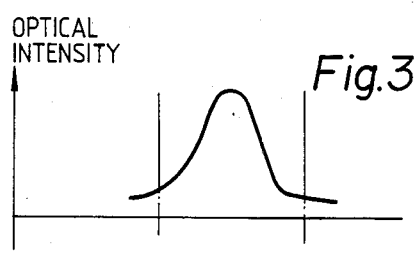
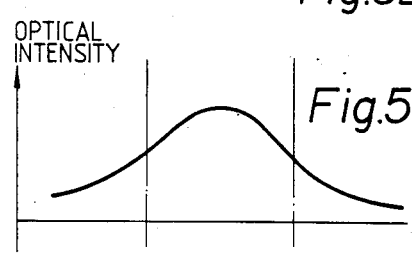
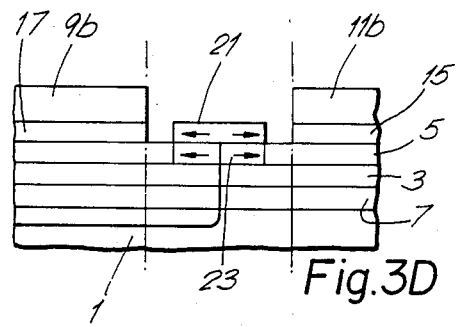
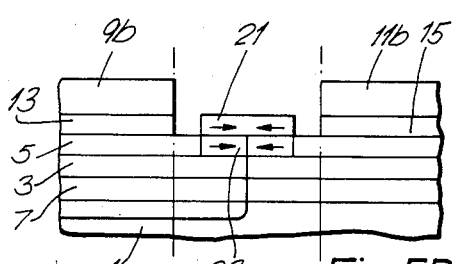
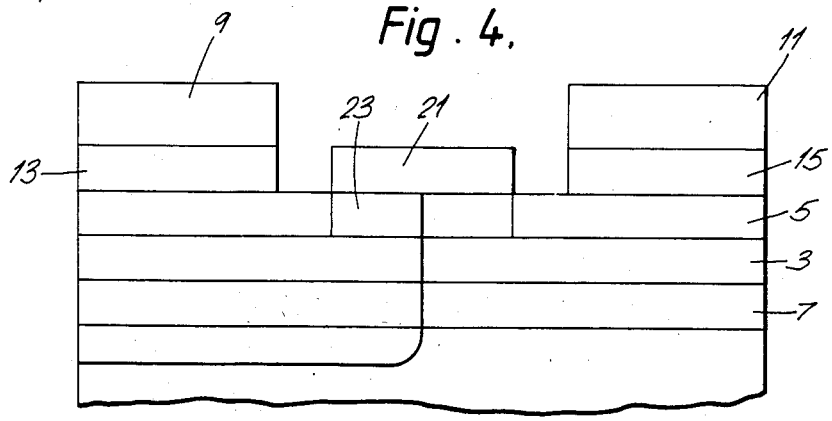

SEMICONDUCTOR DIODE LASERS

BACKGROUND OF THE INVENTION

1. Field of the Invention

This invention relates to semiconductor diode lasers.

2. Description of Related Art

In a semiconductor diode laser radiation is produced in an active region of the diode structure and it is normally required to direct the radiation into an output lightguide, such as an optical fibre.

The active region is normally part of a layer of semiconductor material which is sandwiched between other layers of semiconductor material which may readily be arranged to consist of material having a refractive index different from that of the material of the sandwiched layer so as to confine the radiation to the firstmentioned layer. However, it is more difficult to provide such optical confinement in the plane of the layer containing the active region which is necessary to obtain efficient coupling to the light waveguide.

SUMMARY OF THE INVENTION

1. Objects of the Invention

It is an object of the present invention to provide a semiconductor diode laser wherein this problem is overcome in a simple manner.

2. Features of the Invention

According to the present invention in a semiconductor diode laser of the kind in which laser radiation occurs in an active region in a layer of semiconductor material, optical confinement of the radiation to a portion of said layer so as to direct light from said region to a light waveguide is obtained by virtue of differences in the refractive index of different regions of said layer arising from mechanical stresses in said layer.

The mechanical stresses are suitably obtained by virtue of differential thermal contraction, during fabrication of the laser, of different parts of the laser structure. The different parts are suitably one or more surface layers and an immediately adjacent layer of the laser structure.

BRIEF DESCRIPTION OF THE DRAWINGS

One semiconductor diode laser in accordance with the invention will now be described, by way of example, with reference to the accompanying drawings in which:

FIGS. 3A to 3D are explanatory diagrams relating to the construction and operation of the laser;

FIG. 4 is a diagram illustrating a modification of the laser; and

FIGS. 5A to 5D are explanatory diagrams relating to a further modification of the laser.

DETAILED DESCRIPTION OF THE PREFERRED EMBODIMENTS

Figure 1:
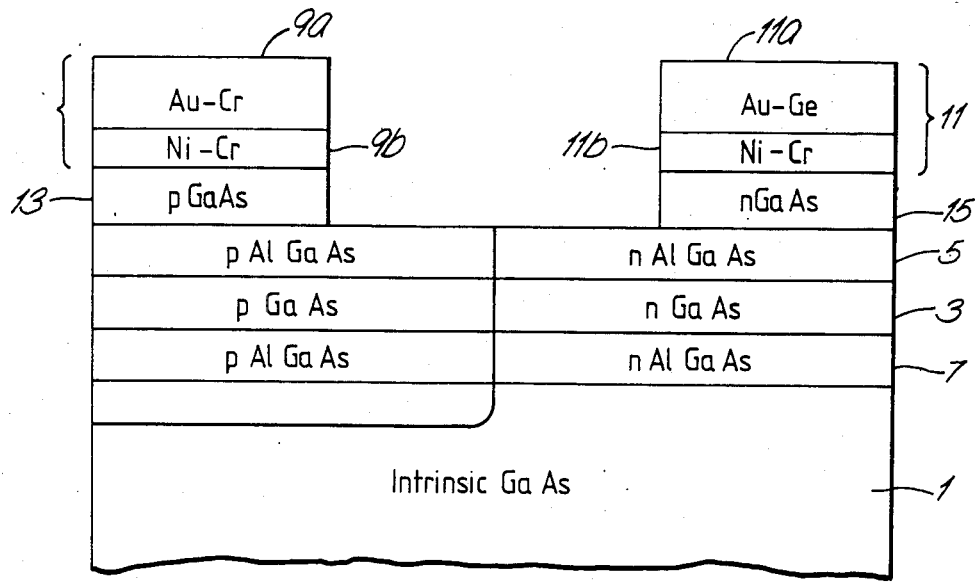
FIG. 1 is a diagrammatic sectional view of the laser.
Figure 2:
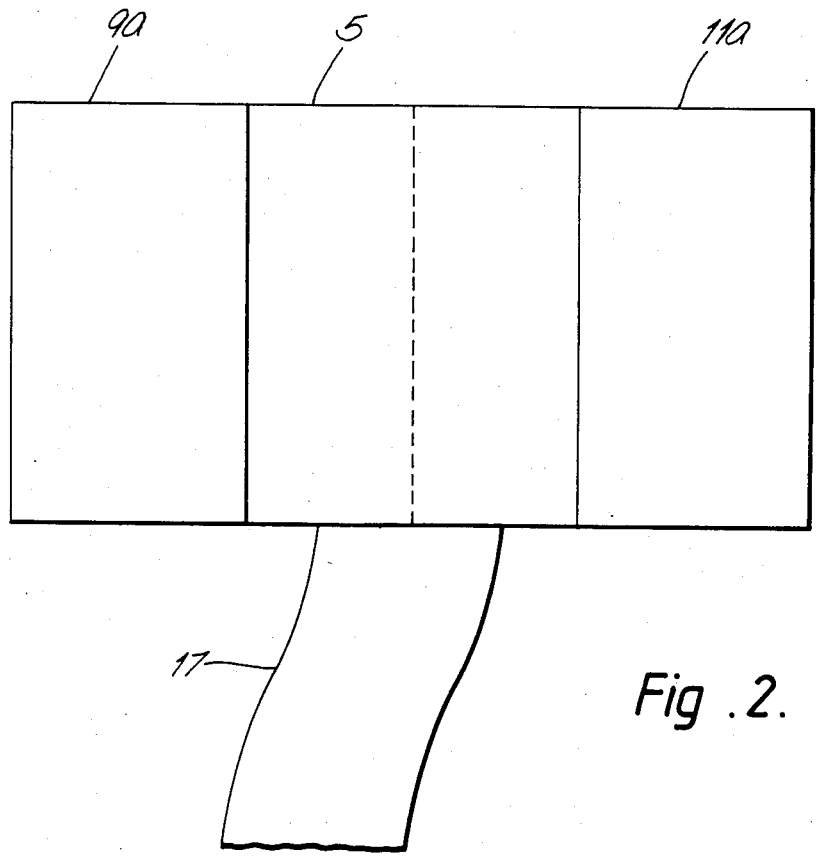
FIG. 2 is a diagrammatic plan view of the laser.

Referring to FIGS. 1 and 2, the laser is formed on a semi-insulating gallium arsenide substrate 1 on one main face of which there is a multi-layer structure comprising a gallium arsenide layer 3 sandwiched between two aluminium-gallium arsenide layers 5 and 7.

Each of the layers 3, 5 and 7 is initially formed entirely of material of n-type conductivity, the structure then being selectively doped to form a p-type conductivity region in part of each of the layers 3, 5 and 7 and the immediately underlying part of the substrate 1, thus providing corresponding transverse p-n junctions in each of the layers 3, 5 and 7.

The laser further includes metal film electrodes 9 and 11 which respectively make electrical contact with the p-type and n-type portions of the outer aluminium-gallium arsenide layer 5 via respective gallium arsenide passivating layers 13 and 15 of p-type and n-type conductivity respectively.

For reasons explained below, each of the electrodes 9 and 11 comprises a gold alloy layer 9a or 11a overlying a thin nickel-chromium alloy layer 9b or 11b. The layer 9a typically comprises a gold-chromium alloy and the layer 11a a gold-germanium alloy.

An output from the laser is derived by way of an optical fibre 17 secured end on to the side of the structure.

In operation of the laser, with the electrode 9 biassed positively with respect to the electrode 11 laser light is produced in known manner at the p-n junction in the layer 3.

By virtue of the differences in the refractive index of the material of the layer 3 and the material of the layers 5 and 7 the laser light is confined to the layer 3. The laser light is further guided through the layer 3 to the optical fibre 17 by virtue of differences in the refractive index of different parts of the layer 3. These differences result from mechanical stresses produced in the layer 3 by virtue of differential thermal contraction of the semiconductor structure and the electrodes 9 and 11, in particular the sub-layers 9b and 11b, during fabrication of the structure, as will now be further explained with reference to FIG. 3.

During fabrication of the laser, the layers 9b and 11b are laid down at an elevated temperature and on cooling to room temperature the layers 9b and 11b contract more than the adjacent semiconductor material. As a result a strip 19 of the semiconductor material, more particularly of the layer 3, extending parallel to the p-n junction and between the optical fibre 17 and the region where laser light is produced in operation is subject to transverse tensile stress at room temperature (see FIG. 3A), and consequently has a higher refractive index than the material on either side of the strip (see FIG. 3B). The laser light is thus optically confined to the portion of layer 3 contained within this strip, as illustrated in FIG. 3C, and is more efficiently coupled to the optical fibre 17.

In addition to improved optical coupling to the optical fibre the optical confinement of radiation to the strip 19 brings about a reduction in the threshold current at which laser action starts to occur and improved stability.

Instead of arranging for the differential thermal contraction of the electrode material and semiconductor material to provide the required differential stressing of the layer 3, the differential stressing may be alternatively or additionally obtained by means of a strip 21 of material laid down on the exposed surface of the layer 5, over the p-n junction, as illustrated in FIG. 4. If the strip 21 consists of a material, such as silicon dioxide or gallium oxide ($Ga_2O_3$), having a lower coefficient of thermal expansion than the semiconductor material of the laser structure, the strip 21, on cooling, produces the required transverse tensile stress in the underlying semiconductor material as illustrated in FIG. 3D.

In a further arrangement, illustrated in FIGS. 3D and 4, the required differential stressing of the layer 3 is alternatively or additionally obtained by arranging for a strip 23 of the layer 5 overlying the p-n junction in the layer 3 to consist of a layer of material having a coefficient of thermal expansion different from that of the surrounding material. The strip 23 is suitably produced by thermal oxidation through a window in an overlayed metal film. Such an arrangement has the advantage that the strip 23 is within the laser structure giving better mechanical stability and lower temperature sensitivity.

In further alternative arrangements in accordance with the invention, illustrated in FIG. 5, the strip 19 of the layer 3 in which laser light is required to be confined is arranged to be subject to compressive stress instead of tensile stress. This may be achieved, for example, by arranging for the electrodes 9 and 11 to contract less than the semiconductor material, as illustrated in FIG. 5A and/or by making the strip 21 and/or the strip 23 of material which contracts more than the underlaying semiconductor material, as illustrated in FIG. 5D. The refractive index in the strip 19 is then lower than that in the adjacent parts of the layer 3, as illustrated in FIG. 5B, but exhibits a secondary peak at the center of the strip 19, thus providing the required optical confinement, as illustrated in FIG. 5C.

It will be understood that whilst the semiconductor diode laser described above by way of example employs a simple, three-layer structure carried on a substrate, a diode in accordance may employ a more sophisticated structure. For example, a fine grating pattern may be formed at the interface between layers 3 and 5 between the electrodes 9 and 11 to provide distributed optical feedback and provide a so-called distributed feedback laser diode. Alternatively or additionally the active region of the diode where laser light is produced in operation may comprise a single or multi quantum well layer structure so as either to shift the laser emission wavelength and/or to reduce the threshold current at which laser action starts to occur.

We claim:

1. A semiconductor diode laser comprising: a semiconductor structure comprising a first layer sandwiched between two further layers, the first layer including an active region in which laser radiation is produced in operation; and a light waveguide having an end disposed adjacent an edge of said first layer so as to receive radiation from said active region; said further layers serving to confine said radiation to said first layer, and said radiation being confined to a portion only of said first layer extending between said active region and said light waveguide by differences in the refractive index of different regions of said first layer, which differences are due to mechanical stresses in said first layer which exist by virtue of differential thermal contraction of a part of a said further layer overlying said active region and another part of said laser during fabrication of said laser.

2. A laser according to claim 1 wherein said another part comprises a further part of said further layer.

3. A laser according to claim 1 wherein said active region is in the region of a p-n junction in said first layer which lies in a plane substantially perpendicular to the plane of said first layer and said portion of said first layer extends in a direction parallel to the plane of said p-n junction.

4. A laser according to claim 1 wherein said semiconductor structure consists of gallium arsenide based materials.

* * * * *